United States Patent
Joshi (10) Patent No.: US 10,381,223 B2
(45) Date of Patent: Aug. 13, 2019

(54) MULTILAYER COMPOSITE BONDING MATERIALS AND POWER ELECTRONICS ASSEMBLIES INCORPORATING THE SAME

(71) Applicant: Toyota Motor Engineering & Manufacturing North America, Inc., Erlanger, KY (US)

(72) Inventor: Shailesh N. Joshi, Ann Arbor, MI (US)

(73) Assignee: Toyota Motor Engineering & Manufacturing North America, Inc., Plano, TX (US)

(*) Notice: Subject to any disclaimer, the term of this patent is extended or adjusted under 35 U.S.C. 154(b) by 0 days.

(21) Appl. No.: 15/824,573

(22) Filed: Nov. 28, 2017

(65) Prior Publication Data

US 2019/0164760 A1 May 30, 2019

(51) Int. Cl.
*H01L 21/20* (2006.01)
*H01L 21/324* (2006.01)

(52) U.S. Cl.
CPC ........ *H01L 21/2007* (2013.01); *H01L 21/324* (2013.01); *H01L 2924/1033* (2013.01); *H01L 2924/1067* (2013.01); *H01L 2924/10272* (2013.01); *H01L 2924/10323* (2013.01); *H01L 2924/10325* (2013.01)

(58) Field of Classification Search
CPC ............... H01L 21/2007; H01L 21/324; H01L 2924/10272; H01L 2924/10323; H01L 2924/10325; H01L 2924/1033; H01L 2924/1067
USPC ........................................................ 257/752
See application file for complete search history.

(56) References Cited

U.S. PATENT DOCUMENTS

| 6,287,122 | B1 | 9/2001 | Seeram et al. |
| 7,565,996 | B2 | 7/2009 | Das |
| 2003/0189082 | A1* | 10/2003 | Dockus ............... B23K 35/002 228/56.3 |
| 2005/0100578 | A1 | 5/2005 | Schmid et al. |
| 2007/0089811 | A1* | 4/2007 | Ikeda ..................... C22F 1/08 148/536 |
| 2009/0004500 | A1 | 1/2009 | Suh et al. |

(Continued)

FOREIGN PATENT DOCUMENTS

| DE | 102007008912 B4 | 1/2009 |
| WO | 2016180671 A1 | 11/2016 |

*Primary Examiner* — Tong-Ho Kim
(74) *Attorney, Agent, or Firm* — Dinsmore & Shohl LLP

(57) ABSTRACT

A multilayer composite bonding material for transient liquid phase bonding a semiconductor device to a metal substrate includes thermal stress compensation layers sandwiched between a pair of bonding layers. The thermal stress compensation layers may include a core layer with a first stiffness sandwiched between a pair of outer layers with a second stiffness that is different than the first stiffness such that a graded stiffness extends across a thickness of the thermal stress compensation layers. The thermal stress compensation layers have a melting point above a sintering temperature and the bonding layers have a melting point below the sintering temperature. The graded stiffness across the thickness of the thermal stress compensation layers compensates for thermal contraction mismatch between the semiconductor device and the metal substrate during cooling from the sintering temperature to ambient temperature.

20 Claims, 8 Drawing Sheets

(56) References Cited

U.S. PATENT DOCUMENTS

| | | |
|---|---|---|
| 2014/0238213 A1 | 8/2014 | Monceau et al. |
| 2015/0008253 A1* | 1/2015 | Yoon .................... B23K 20/026 |
| | | 228/179.1 |

* cited by examiner

MULTILAYER COMPOSITE BONDING MATERIALS AND POWER ELECTRONICS ASSEMBLIES INCORPORATING THE SAME

TECHNICAL FIELD

The present specification generally relates to bonding material, and more particularly, to multilayer composite bonding materials for transient liquid phase bonding of semiconductor devices to metal substrates during the manufacture of power electronics assemblies.

BACKGROUND

Power electronics devices are often utilized in high-power electrical applications, such as inverter systems for hybrid electric vehicles and electric vehicles. Such power electronics devices include power semiconductor devices such as power IGBTs and power transistors thermally bonded to a metal substrate. The metal substrate may then be further thermally bonded to a cooling structure, such as a heat sink.

With advances in battery technology and increases in electronics device packaging density, operating temperatures of power electronics devices have increased and are currently approaching 200° C. Accordingly, traditional electronic device soldering techniques no longer provide suitable bonding of semiconductor devices to metal substrates and alternative bonding techniques are needed. One such alternative bonding technique is transient liquid phase (TLP) sintering (also referred to herein as "TLP bonding"). The TLP sintering of a power electronics device utilizes a bonding layer sandwiched between a semiconductor device and metal substrate. The bonding layer at least partially melts and isothermally solidifies to form a TLP bond between the semiconductor device and metal substrate at TLP bonding temperatures (also referred to as sintering temperatures) between about 280° C. to about 350° C. The semiconductor devices and metal substrates have different coefficients of thermal expansion (CTE) and large thermally-induced stresses (e.g., cooling stresses) may be generated between a semiconductor device and metal substrate upon cooling from a TLP sintering temperature. The large thermal cooling stresses due to CTE mismatch between the power semiconductor device and metal substrate may result in delamination between the semiconductor device and metal substrate of a power electronics device when currently known bonding layers are used to form the TLP bond.

Accordingly, a need exists for alternative bonding layers that compensate for thermal cooling stresses between power semiconductor devices thermally bonded to metal substrates via TLP sintering.

SUMMARY

In one embodiment, a multilayer composite bonding material for TLP bonding includes thermal stress compensation layers sandwiched between a pair of bonding layers. The thermal stress compensation layers may include a core layer with a first stiffness sandwiched between a pair of outer layers with a second stiffness that is different than the first stiffness such that a graded stiffness extends across a thickness of the thermal stress compensation layers. The thermal stress compensation layers have a melting point above a sintering temperature and the bonding layers have a melting point below the sintering temperature. The sintering temperature may be in a range between about 280° C. and 350° C. In some embodiments, the first stiffness is less than the second stiffness. In other embodiments, the first stiffness is greater than the second stiffness. The pair of bonding layers may each have a thickness between about 2 microns and about 10 microns, the core layer may have a thickness between about 50 microns and about 150 microns, and the pair of outer layers may each have a thickness between about 2 microns and about 10 microns. The core layer may comprise aluminum, the pair of outer layers may comprise silver and the pair of bonding layers may comprise tin.

In another embodiment, a power electronics assembly includes a semiconductor device extending across a metal substrate and a multilayer composite bonding material sandwiched between and transient liquid phase (TLP) bonded to the semiconductor device and metal substrate. The multilayer composite bonding material may include thermal stress compensation layers with a core layer that has a first stiffness sandwiched between a pair of outer layers that have a second stiffness that is different than the first stiffness such that a graded stiffness extends across a thickness of the thermal stress compensation layers. The thermal stress compensation layers may have a melting point above a TLP sintering temperature that is in a range between about 280° C. and 350° C. In some embodiments, the first stiffness is less than the second stiffness while in other embodiments the first stiffness is greater than the second stiffness. The core layer may have a thickness between about 50 microns and about 150 microns and the pair of outer layers may each have a thickness between about 2 microns and about 10 microns. The core layer may be formed from aluminum, the pair of outer layers may be formed from silver and the pair of bonding layers may be formed from tin. The metal substrate may be formed from copper and the semiconductor device may be formed from a wide band gap semiconductor material illustratively including but not limited to silicon carbide (SiC), silicon dioxide ($SiO_2$), aluminum nitride (AlN), gallium nitride (GaN), boron nitride (BN) and diamond.

In yet another embodiment, a process for manufacturing a power electronics assembly includes positioning a multilayer composite bonding material between a metal substrate and a semiconductor device to provide a metal substrate/semiconductor device assembly. The multilayer composite bonding material includes thermal stress compensation layers sandwiched between a pair of bonding layers. The thermal stress compensation layers may have a core layer with a first stiffness sandwiched between a pair of outer layers with a second stiffness that is different than the first stiffness such that a graded stiffness is present across a thickness of the thermal stress compensation layers. The metal substrate/semiconductor device assembly is heated to a TLP sintering temperature between about 280° C. and 350° C. The pair of bonding layers have a melting point less than the TLP sintering temperature and the thermal stress compensation layers have a melting point greater than the TLP sintering temperature such that the pair of bonding layers at least partially melt and form a TLP bond with the metal substrate and semiconductor device. The power electronics assembly is cooled from the sintering temperature to ambient temperature and the multilayer composite bonding material with the graded stiffness compensates for thermal contraction mismatch between the semiconductor device and the metal substrate during cooling from the sintering temperature to ambient temperature. In some embodiments the first stiffness is less than the second stiffness while in other embodiments the first stiffness is greater than the second stiffness. The core layer may have a thickness between about 50 microns and about 150 microns, the pair of outer layers may each have a thickness between about 2 microns and about 10 microns, and the pair of bonding layers may each have a thickness between 2 microns and about 10 microns. The core layer may be formed from aluminum, the pair of outer layers may be formed from silver and the pair of bonding layers may be formed from tin. The metal substrate may be formed from copper and the semiconductor device is formed from a wide band gap semiconductor material illustratively including but not limited to silicon carbide (SiC), silicon dioxide ($SiO_2$), aluminum nitride (AlN), gallium nitride (GaN), boron nitride (BN) and diamond.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
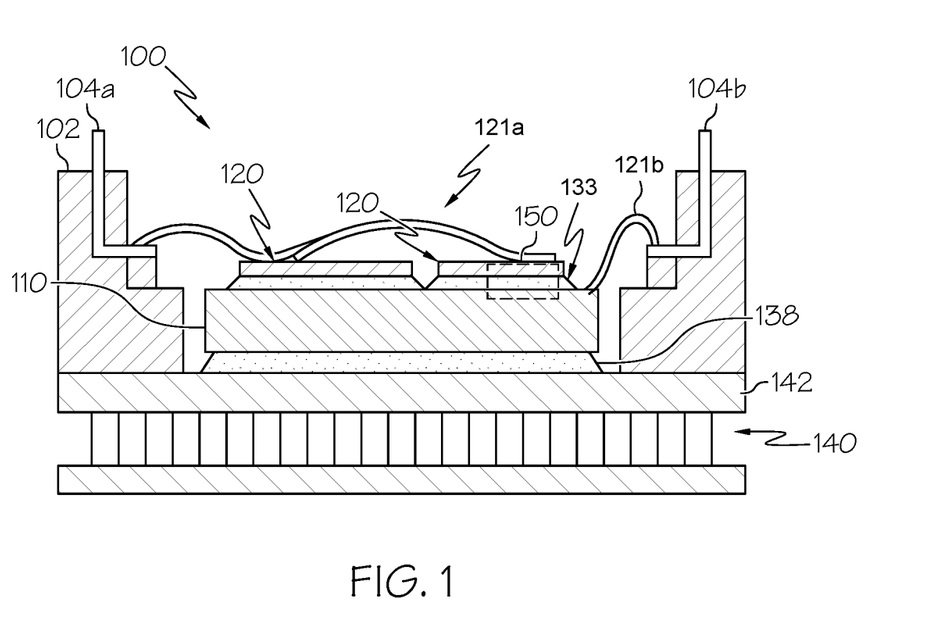
FIG. 1 schematically depicts a side view of a power electronics assembly having a power semiconductor device thermally bonded to a metal substrate with a multilayer composite bonding material according to one or more embodiments shown and described herein.

FIG. 1 generally depicts one embodiment of a power electronics assembly. The power electronics assembly comprises a power semiconductor device (semiconductor device) thermally bonded to a metal substrate with a multilayer composite bonding material that compensates for thermally-induced stresses generated or resulting from fabrication and operation of the power electronics assembly. The thermally-induced stresses are due to coefficient of thermal expansion (CTE) mismatch between the semiconductor device and metal substrate of the power electronics assembly. The multilayer composite bonding material comprises a plurality of thermal stress compensation layers that include a core layer with a first stiffness and a pair of outer layers with a second stiffness that is different that the first stiffness. The outer layers extend across the core layer such that the core layer is sandwiched between the pair of outer layers and a graded stiffness extends across the plurality of thermal stress compensation layers. As used herein, the term "graded thickness" refers to a change in thickness as a function of a distance, e.g., a thickness or a length. In embodiments, the plurality of thermal stress compensation layers are sandwich between a pair of bonding layers. The plurality of thermal stress compensation layers have a melting point that is greater than a sintering temperature used to provide a transient liquid phase (TLP) bond between the semiconductor device and the metal substrate and the pair of bonding layers have a melting point that is less than the sintering temperature. Various embodiments of multilayer composite bonding materials and power electronics assemblies using multilayer composite bonding materials will be described in more detail herein.

Referring initially to FIG. 1, one embodiment of a power electronics assembly 100 is illustrated. The power electronics assembly 100 generally comprises a metal substrate 110, two semiconductor devices 120 thermally bonded to the metal substrate via a multilayer composite bond layer 133, a cooling structure 140, and a package housing 102.

The thicknesses of the metal substrate 110 and the semiconductor devices 120 may depend on the intended use of the power electronics assembly 100. In one embodiment, the metal substrate 110 has a thickness within the range of about 2.0 mm to about 4.0 mm, and the semiconductor device 120 has a thickness within the range of about 0.1 mm to about 0.3 mm. For example and without limitation, the metal substrate may have a thickness of about 3.0 mm and the semiconductor device 120 may have a thickness of about 0.2 mm. It should be understood that other thicknesses may be utilized.

The metal substrate 110 may be formed from a thermally conductive material such that heat from the semiconductor devices 120 is transferred to the cooling structure 140. The metal substrate may be formed copper (Cu), e.g., oxygen free Cu, aluminum (Al), Cu alloys, Al alloys, and the like. The semiconductor devices 120 may be formed from a wide band gap semiconductor material suitable for the manufacture or production of power semiconductor devices such as power IGBTs and power transistors. In embodiments, the semiconductor devices 120 may be formed from wide band gap semiconductor materials including without limitation silicon carbide (SiC), silicon dioxide ($SiO_2$), aluminum nitride (AlN), gallium nitride (GaN), boron nitride (BN), diamond, and the like. In embodiments, the metal substrate 110 and the semiconductor devices 120 may comprise a coating, e.g., nickel (Ni) plating, to assist in the TLP sintering of the semiconductor devices 120 to the metal substrate 110.

As depicted in FIG. 1, a metal substrate 110 is thermally bonded to two semiconductor devices 120 via a multilayer composite bond layer 133. More or fewer semiconductor devices 120 may be attached to the metal substrate 110. In some embodiments, heat generating devices other than power semiconductor devices may be attached to the metal substrate 110. The semiconductor devices 120 may be power semiconductor devices such as IGBTs, power diodes, power MOSFETs, power transistors, and the like. In one embodiment, the semiconductor devices 120 of one or more power electronics assemblies are electrically coupled to form an inverter circuit or system for vehicular applications, such as for hybrid vehicles or electric vehicles, for example.

The metal substrate 110 is thermally coupled to the cooling structure 140 via a bond layer 138. In one embodiment, the cooling structure 140 comprises an air-cooled heat sink. In an alternative embodiment, the cooling structure 140 comprises a liquid-cooled heat sink, such as a jet impingement or channel-based heat sink device. The metal substrate 110 of the illustrated embodiment is directly bonded to a first surface 142 of the cooling structure 140 via the bond layer 138 without any additional interface layers (e.g., additional metal base plates). The metal substrate 110 may be bonded to the cooling structure 140 using a variety of bonding techniques, such as by TLP sintering, solder, brazing, or diffusion bonding, for example. However, in an alternative embodiment, one or more thermally conductive interface layers may be positioned between the metal substrate 110 and the cooling structure 140.

Still referring to FIG. 1, the metal substrate 110 may be maintained within a package housing 102, which may be made of a non-electrically conductive material such as plastic, for example. The package housing 102 may be coupled to the cooling structure 140 by a variety of mechanical coupling methods, such as by the use of fasteners or adhesives, for example.

Within the power electronics assembly 100 may be a first electrical contact 104a and a second electrical contact 104b to provide electrical power connections to the semiconductor devices 120. The first electrical contact 104a may correspond to a first voltage potential and the second electrical contact 104b may correspond to a second voltage potential. In the illustrated embodiment, the first electrical contact 104a is electrically coupled to a first surface of the semiconductor devices 120 via a first electrical wire 121a, and the second electrical contact 104b is electrically coupled to a second surface of the semiconductor devices 120 via a second electrical wire 121b and the metal substrate 110. It should be understood that other electrical and mechanical configurations are possible, and that embodiments are not limited by the arrangement of the components illustrated in the figures.

Figure 2:
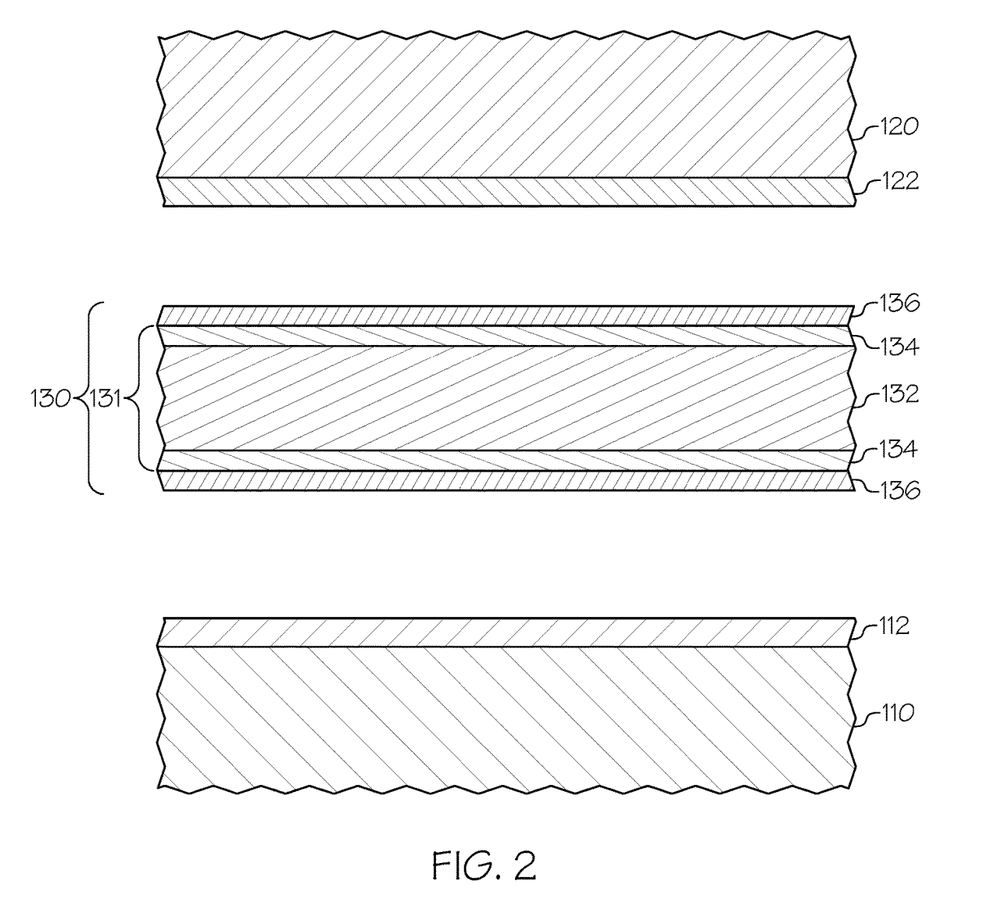
FIG. 2 schematically depicts an exploded view of box 150 depicted in FIG. 1 according to one or more embodiments shown and described herein.

Referring now to FIG. 2, an exploded view of the region designated by box 150 in FIG. 1 before TLP sintering of the semiconductor devices 120 to the metal substrate 110 is schematically depicted. A multilayer composite bonding material 130 that provides or results in the multilayer composite bond layer 133 comprises a plurality of thermal stress compensation layers 131 that include a core layer 132 and a pair of outer layers 134. The core layer 132 may be sandwiched between and in direct contact with the pair of outer layers 134. The core layer 132 has a first stiffness and the pair of outer layers 134 each have a second stiffness that is different than the first stiffness. In embodiments, the first stiffness is less than the second stiffness. In other embodiments, the first stiffness is greater than the second stiffness. As used herein, the term stiffness refers to the elastic modulus of a material, i.e., a measure of a material's resistance to being deformed elastically when a force is applied to the material. The plurality of thermal stress compensation layers 131 may be sandwiched between a pair of bonding layers 136. The pair of bonding layers 136 have a melting point that is less than a melting point of any of the thermal stress compensation layers 131. Particularly, the pair of bonding layers 136 have a melting point that is less than a sintering temperature used to TLP bond the semiconductor device 120 to the metal substrate 110, and the core layer 132 and pair of outer layers 134 have a melting temperature that is greater than the sintering temperature. In embodiments, the sintering temperature is in a range between about 280° C. and about 350° C. For example, the sintering temperature may be greater than about 300° C. and less than about 330° C. Accordingly, the pair of bonding layers 136 at least partially melt and the thermal stress compensation layers 131 do not melt during TLP sintering of the semiconductor device 120 to the metal substrate 110.

The multilayer composite bonding material 130 and multilayer composite bond layer 133 described herein compensates thermally-induced stresses, e.g., thermal cooling stresses, resulting from fabrication (e.g., TLP sintering) and operational conditions (e.g., transient electric loads causing high changes in temperature). Because the metal substrate 110 and semiconductor devices 120 of the power electronics assembly 100 are made of differing materials, differences in the CTE for each material may cause large thermally-induced stresses within the metal substrate 110, semiconductor devices 120 and multilayer composite bond layer 133. It should be understood that the large thermally-induced stresses may result in failure of the power electronics assembly 100 due to fracturing of the metal substrate 110 or failure of a traditional TLP bonding material (e.g., delamination) between the metal substrate 110 and one or both of the semiconductor devices 120. The use of the multilayer composite bonding material 130 to TLP bond the metal substrate 110 to the semiconductor devices 120 alleviates or mitigates such stresses. The multilayer composite bonding material 130 and multilayer composite bond layer 133 described herein compensate for the thermal expansion and contraction experienced by the metal substrate 110 and semiconductor devices 120. In some embodiments, the multilayer composite bonding material 130 and multilayer composite bond layer 133 described herein compensate for the thermal expansion and contraction experienced by the metal substrate 110 and semiconductor devices 120 using a graded stiffness across the thickness of the multilayer composite bonding material 130 and multilayer composite bond layer 133. The graded stiffness allows the multilayer composite bond layer 133 to plastically deform and not delaminate due to the CTE mismatch between the metal substrate 110 and semiconductor devices 120, and yet provide sufficient stiffness to such that the semiconductor devices 120 are adequately secured to the metal substrate 110 for subsequent manufacturing steps performed on the semiconductor devices 120. The multilayer composite bond layer 133 also provides sufficient high temperature bonding strength between the metal substrate 110 and semiconductor devices 120 during operating temperatures approaching and possibly exceeding 200° C.

The multilayer composite bonding material 130 described herein is formed from a variety of materials that provide a graded stiffness across the thickness of the multilayer composite bonding material 130 and multilayer composite bond layer 133. In embodiments, the stiffness of the core layer 132 (first stiffness) is less than the stiffness of the outer layers 134 (second stiffness). For example, the core layer 132 may be formed from Al with an elastic modulus ($E_{Al}$) of about 69.0 gigapascals (GPa) and the outer layers 134 may be formed from silver (Ag) with an elastic modulus ($E_{Ag}$) of about 72.4 GPa or zinc (Zn) with an elastic modulus ($E_{Zn}$) of about 82.8 GPa. In another example, the core layer 132 may be formed from Al ($E_{Al} \approx 69.0$ GPa) and the outer layers 134 may be formed from Cu with an elastic modulus ($E_{Cu}$) of about 115 GPa. In yet another example, the core layer 132 may be formed from manganese (Mg) with an elastic modulus ($E_{Mg}$) of about 45.0 GPa and the outer layers 134 may be formed from Ag ($E_{Ag} \approx 72.4$ GPa) or Zn ($E_{Zn} \approx 82.8$ GPa). In other embodiments, the stiffness of the core layer 132 is greater than the stiffness of the outer layers 134. For example, the core layer 132 may be formed from Al ($E_{Al}$≈69.0 GPa) and the outer layers 134 may be formed from Mg ($E_{Mg}$≈45.0 GPa). Table 1 below provides a non-limiting summary of possible materials used for the core layer 132 and outer layers 134. It should be understood that the metals listed in Table 1 from the which the core layer 132 and outer layers 134 are formed include alloys of the metals, e.g., Al alloys, Ag alloys, Zn alloys and Mg alloys which may be used to alter and adjust the stiffness of a given layer and the graded stiffness of the multilayer composite bond layer 133.

TABLE 1

| Core Layer (CL) – Outer Layer (OL) Layer Structure | Core Layer Elastic Modulus ($E_{CL}$) | Outer Layers Elastic Modulus ($E_{OL}$) |
| --- | --- | --- |
| Ag/Al/Ag ($E_{CL} < E_{OL}$) | Al ($E_{Al}$ ≈ 69.0 GPa) | Ag ($E_{Ag}$ ≈ 72.4 GPa) |
| Cu/Al/Cu ($E_{CL} < E_{OL}$) | Al ($E_{Al}$ ≈ 69.0 GPa) | Cu ($E_{Cu}$ ≈ 115.0 GPa) |
| Ag/Mg/Ag ($E_{CL} < E_{OL}$) | Mg ($E_{Mg}$ ≈ 45.0 GPa) | Ag ($E_{Ag}$ ≈ 72.4 GPa) |
| Cu/Mg/Cu ($E_{CL} < E_{OL}$) | Mg ($E_{Mg}$ ≈ 45.0 GPa) | Cu ($E_{Cu}$ ≈ 115.0 GPa) |

Generally, the core layer 132 and outer layers 134 comprise flat thin films. The thickness of the core layer 132 may be between about 25 micrometers (microns) and about 200 microns. In embodiments, the core layer has a thickness between about 50 microns and about 150 microns. In other embodiments, the core layer has a thickness between about 75 microns and 125 microns, for example a thickness of 100 microns. The thickness of the outer layers 134 may be between 1 micron and 20 microns. In embodiments, the outer layers 134 each have a thickness between about 2 microns and about 15 microns.

In embodiments, a bonding layer 136 may be included and extend across the outer layers 134 as depicted in FIG. 2. In the alternative, or in addition to, a bonding layer 112 (e.g., as Sn layer) may extend across a surface of the metal substrate 110 facing the multilayer composite bonding material 130 and/or a bonding layer 122 (e.g., a Sn layer) may extend across a surface of the semiconductor devices 120 facing the multilayer composite bonding material 130 as depicted in FIG. 2. In another alternative, a bonding assist layer 112 (e.g., a Ni layer) may extend across a surface of the metal substrate 110 facing the multilayer composite bonding material 130 and/or a bonding assist layer 122 (e.g., a Ni layer) may extend across a surface of the semiconductor devices 120 facing the multilayer composite bonding material 130 as depicted in FIG. 2. As used herein, the term "bonding assist layer" to a layer formed from a material with a temperature above the TLP sintering temperature that assists in the formation of a TLP bond layer during a TLP bonding process.

The core layer 132 and outer layers 134 have melting points greater than a TLP sintering temperature used to form a TLP bond between the metal substrate 110 and semiconductor devices 120, and the bonding layers 136, 112, 122 have a melting point that is less than the TLP sintering temperature. In embodiments, the TLP sintering temperature is between about 280° C. and about 350° C. and the bonding layers 136, 112, 122 have a melting point less than about 280° C. and the core layer 132 and outer layers 134 have melting points greater than 350° C. For example, the bonding layers 136, 112 and/or 122 may be formed from Sn with a melting point of about 232° C., whereas core layer 132 and outer layer 134 materials such as Al, Ag, Zn, Cu, and Mg have a melting point of about 660° C., 962° C., 420° C., 1085° C., and 650° C., respectively. Accordingly, the bonding layers 136, 112, 122 at least partially melt and the core layer 132 and outer layers 134 do not melt during TLP bonding of the semiconductor devices 120 to the metal substrate 110. In embodiments where the bonding assist layer 112 (e.g., a Ni layer) extends across a surface of the metal substrate facing the multilayer composite bonding material 130 and/or the bonding assist layer 122 (e.g., a Ni layer) extends across a surface of the semiconductor devices 120 facing the multilayer composite bonding material 130, the bonding assist layers 112, 122 have melting points greater than 350° C. For example, the bonding assist layers 112, 122 may be formed from Ni with a melting point of about 1455° C.

The multilayer composite bonding material 130 may be formed using conventional multilayer thin film forming techniques illustratively including but not limited to roll bonding of the outer layers 134 to the core layer 132, chemical vapor depositing the outer layers 134 onto the core layer 132, physical vapor depositing the outer layers 134 on the core layer 132, electrolytically depositing the outer layers 134 onto the core layer 132, electroless depositing the outer layers 134 onto the core layer 132, and the like. In embodiments, the bonding layers 136 are roll bonded to the multilayer composite bonding material 130. In the alternative, the bonding layers 136 are deposited onto the multilayer composite bonding material 130 using chemical vapor deposition, physical vapor deposition, electrochemical deposition, electroless deposition and the like.

Figure 3:
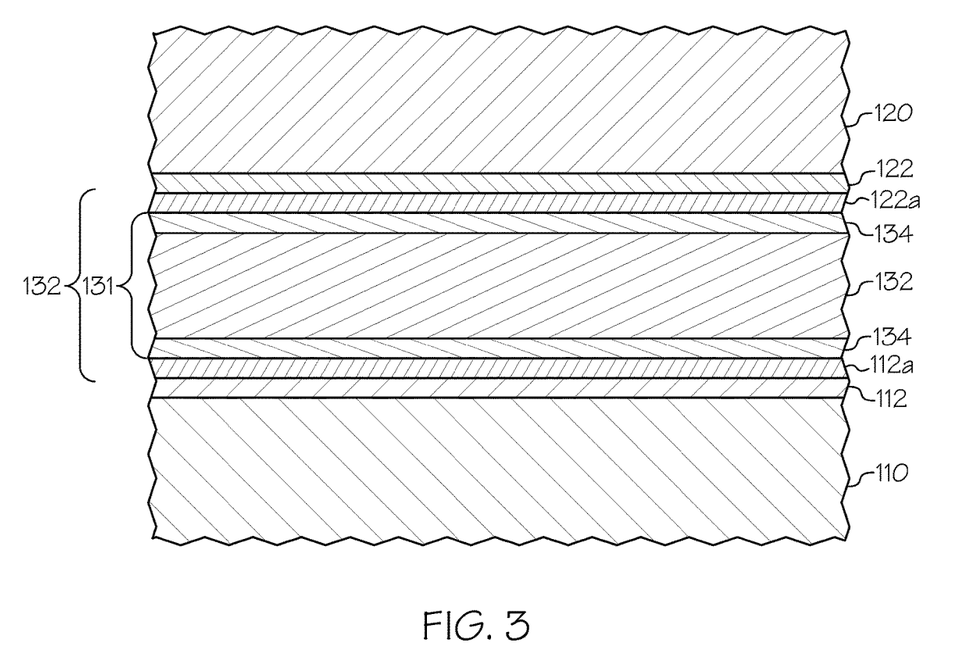
FIG. 3 schematically depicts an enlarged view of box 150 depicted in FIG. 1.

Referring now to FIG. 3, an enlarged view of the region designated by box 150 in FIG. 1 after the semiconductor devices 120 have been TLP bonded to the metal substrate 110 is schematically depicted. As illustrated in FIG. 3, after the semiconductor devices 120 have been TLP bonded to the metal substrate 110, the core layer 132 and outer layers 134 remain as in FIG. 2, i.e., the core layer 132 and the outer layers 134 do not melt during the TLP bonding process and generally remain the same thickness as before the TLP bonding process. It is understood that diffusion may occur between the core layer 132 and outer layers 134 during the TLP bonding process but neither the core layer 132 nor the outer layers 134 melt during the TLP bonding process. In contrast, the bonding layers 136 at least partially melt and form TLP bond layers 112a and 122a. It should be understood that the TLP bond layers 112a and 122a may comprise one or more intermetallics. Non-limiting examples of intermetallics that form during the TLP bonding process when the outer layers are formed from Cu, the bonding layers 134 are formed from Sn and the boning assist layers 112, 122 are formed from Ni include (Cu,Ni)6Sn5 and Ni3Sn4. It should also be understood that melting points of the intermetallic layers are greater than the melting point of the bonding layers 134 and thus isothermal solidification of the bonding layer material occurs during the formation of the intermetallic layers. Although TLP bond layers 112a and 122a depicted in FIG. 3 have two layers, in embodiments the TLP bond layers 112a and/or 122a may comprise only one layer between the metal substrate 110 and adjacent outer layer 134, and the semiconductor device 120 and adjacent outer layer 134, respectively. In other embodiments, the TLP bond layers 112a and/or 122a may comprise no layers, i.e., all of the bonding layers 136, 112 and 122 diffuse into the adjacent outer layers 134, metal substrate 110 and/or semiconductor device 120 thereby resulting in a clearly defined TLP bond layer 112a and/or 122a not being present.

Figure 4:
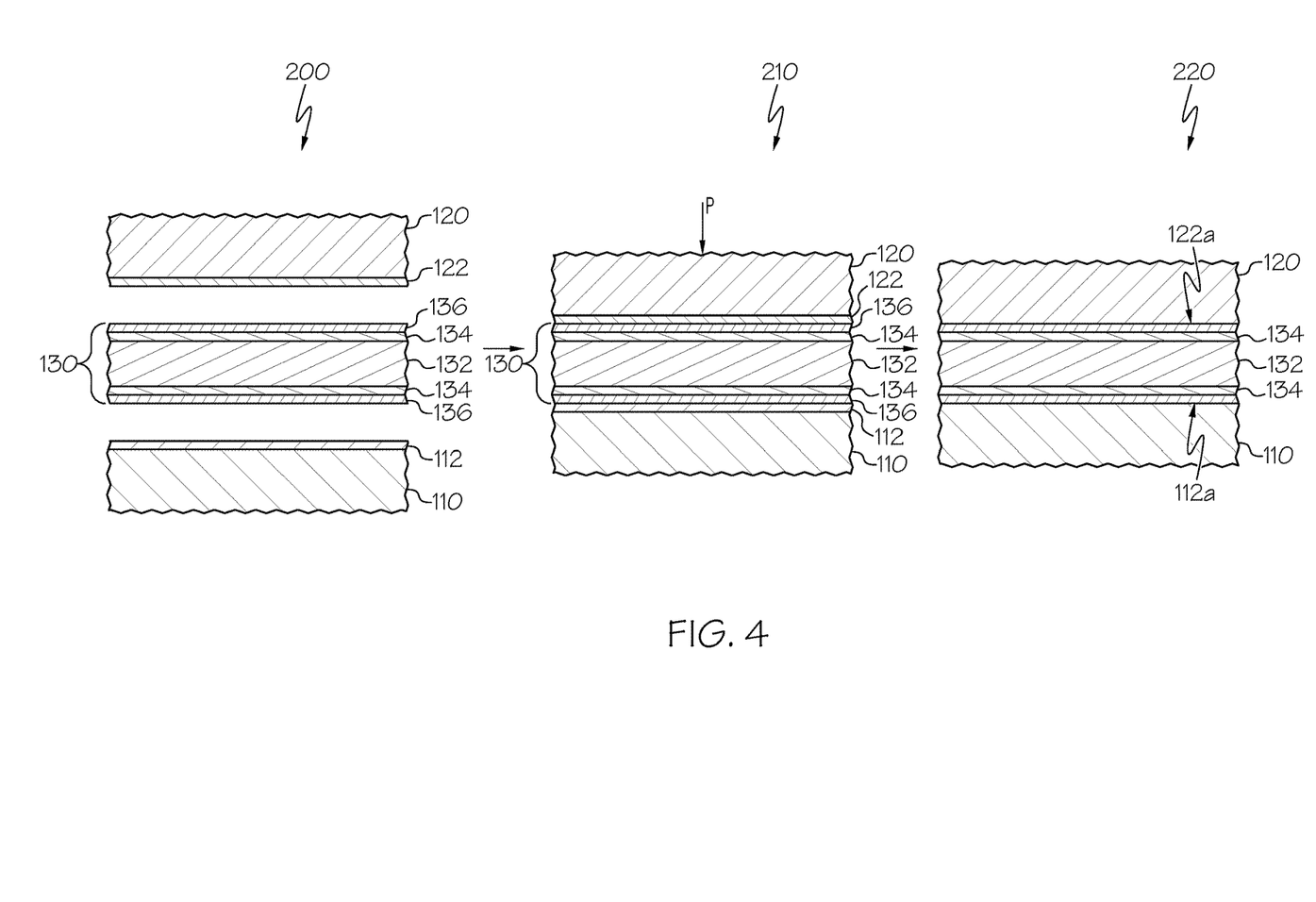
FIG. 4 schematically depicts of a process for thermally bonding a power semiconductor device to a metal substrate according to one or more embodiments shown and described herein.

Referring now to FIG. 4, a process for thermally bonding a power semiconductor device to a metal substrate with a multilayer composite bonding material is depicted. Particularly, at step 200 a multilayer composite bonding material 130 is positioned between the metal substrate 110 and the semiconductor device 120. In embodiments, the multilayer composite bonding material 130 comprises the plurality of thermal stress compensation layers 131 that include the core layer 132 and the pair of outer layers 134. The core layer 132 may be sandwiched between and in direct contact with the pair of outer layers 134. The core layer 132 has a first stiffness and the pair of outer layers 134 each have a second stiffness that is different than the first stiffness. In embodiments, the first stiffness is less than the second stiffness. In other embodiments, the first stiffness is greater than the second stiffness. The plurality of thermal stress compensation layers 131 may be sandwiched between and in direct contact with the pair of bonding layers 136. The pair of bonding layers 136 have a melting point that is less than a melting point of any of the thermal stress compensation layers 131. Particularly, the pair of bonding layers 136 have a melting point that is less than a sintering temperature used to TLP bond the semiconductor device 120 to the metal substrate 110, and the core layer 132 and pair of outer layers 134 have a melting temperature that is greater than the sintering temperature. The metal substrate 110 may have a bonding layer 112 extending across a surface of the metal substrate proximate to and facing the multilayer composite bonding material 130 and the semiconductor device 120 may have a bonding layer 122 extending across a surface of the semiconductor device 120 proximate to and facing the multilayer composite bonding material 130.

Still referring to FIG. 4, at step 210 the multilayer composite bonding material 130 is brought into direct contact with the metal substrate 110 and the semiconductor device 120 to provide a metal substrate/semiconductor device assembly. In embodiments where the plurality of thermal stress compensation layers 131 are sandwiched between the pair of bonding layers 136, the metal substrate 110 has the bonding layer 112 and the semiconductor device 120 has the bonding layer 122, the pair of bonding layers 136 are brought into direct contact with the bonding layer 112 and bonding layer 122. In some embodiments, a pressure P may or may not be applied to the semiconductor device 120 in order to ensure contact between the metal substrate 110 (or bonding layer 112), multilayer composite bonding material 130 and semiconductor device 120 (or bonding layer 122) is maintained during the TLP bonding process. For example, no pressure (0.0 megapascals (MPa)) may be applied to the semiconductor device, or in the alternative, a pressure between about 0.1 MPa and 10 MPa, e.g., a pressure between 0.5 MPa and 1.5 MPa may be applied to the semiconductor device. Also, the force F may ensure the semiconductor device 120 does not move relative to the metal substrate 110 during the TLP bonding process. At step 220 the metal substrate 110, semiconductor device 120 and multilayer composite bonding material 130 are heated to a TLP sintering temperature resulting in TLP bonding of the metal substrate 110 to the semiconductor device 120. In embodiments, heat is applied to the metal substrate 120 which in turn provides for heating of the multilayer composite bonding material 130 and semiconductor device. After heating to the TLP sintering temperature, the metal substrate/semiconductor device assembly is cooled to ambient temperature. As used herein, the term "ambient temperature" refers to room temperature, e.g., to a temperature less than about 25° C. such as between about 20° C. and 22° C. It should be understood that at step 210 or step 220 the metal substrate/semiconductor device assembly may be placed in a furnace for heating to the TLP sintering temperature and the furnace may comprise an inert or reducing gas atmosphere. Illustrative examples of inert gas atmospheres include but are not limited to atmospheres of helium, argon, neon, xenon, krypton, radon and combinations thereof. Illustrative examples of reducing gas atmospheres include but are not limited to hydrogen, argon plus hydrogen, helium plus hydrogen, neon plus hydrogen, xenon plus hydrogen, krypton plus hydrogen, radon plus hydrogen, and combinations thereof.

Upon heating the metal substrate/semiconductor device assembly to the TLP sintering temperature, the at least one of the bonding layer 112, bonding layer 122 and bonding layers 136 at least partially melt and diffuse into metal substrate 110, semiconductor device 120 and outer layers 134. Not being bound by theory, as the bonding layers 112, 122, 136 diffuse into surrounding material the composition of the bonding layers 112, 122, 136 is altered such that isothermal solidification of TLP bond layers 112a and 122a occurs and TLP bonding between the metal substrate 110 and the adjacent outer layer 134, and between semiconductor device 120 and adjacent outer layer 134, is provided. That is, the semiconductor device 120 is thermally bonded to the metal substrate 110.

Figure 5:
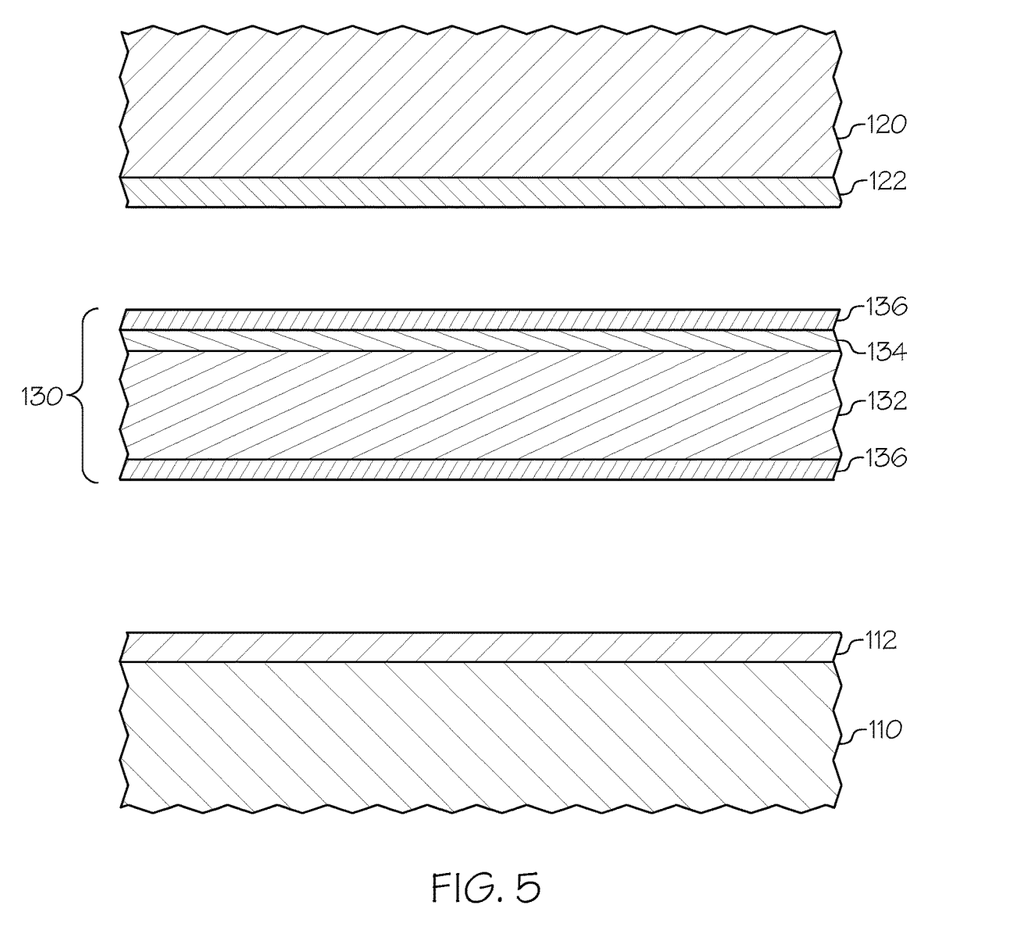
FIG. 5 schematically depicts an exploded view of box 150 depicted in FIG. 1 according to one or more embodiments shown and described herein.
Figure 6:
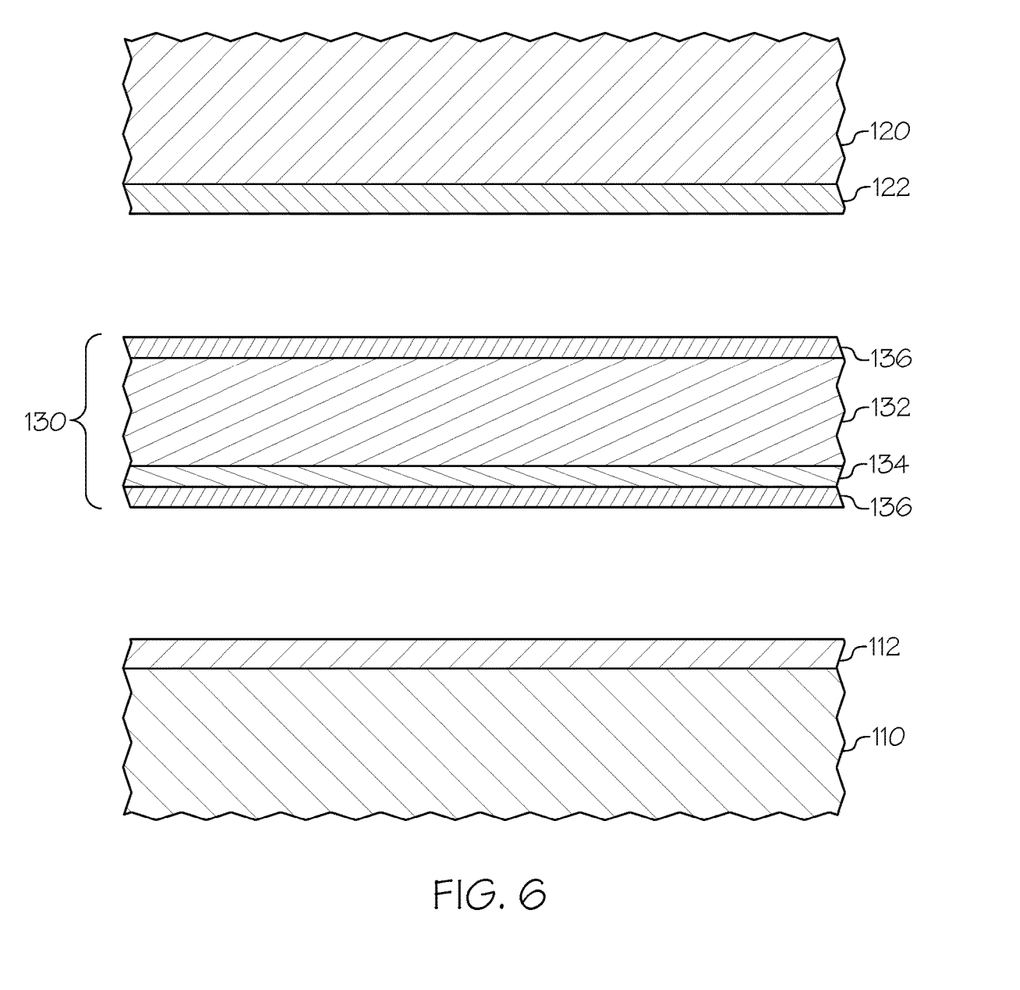
FIG. 6 schematically depicts an exploded view of box 150 depicted in FIG. 1 according to one or more embodiments shown and described herein.
Figure 7:
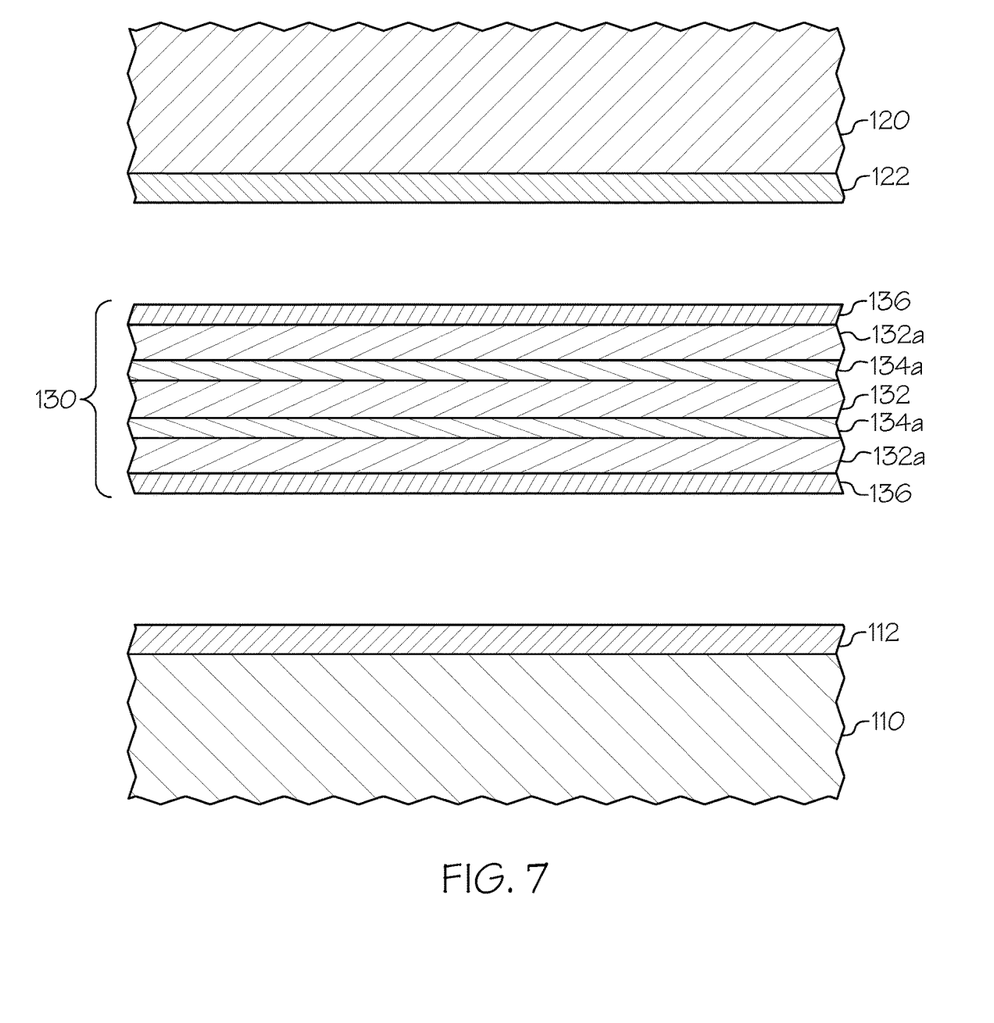
FIG. 7 schematically depicts an exploded view of box 150 depicted in FIG. 1 according to one or more embodiments shown and described herein.

Referring now to FIGS. 5-7, other embodiments of multilayer composite bonding materials 130 are depicted. Particularly, FIG. 5 depicts the multilayer composite bonding material 130 with the core layer 132 and a single outer layer 134 proximate to the semiconductor device 120 sandwiched between the pair of bonding layers 136. That is, FIG. 5 depicts the multilayer composite bonding material 130 comprising only one outer layer 134. In embodiments, a bonding layer 112 or a bonding assist layer 112 may extend across a surface of the metal substrate 110 proximate to and facing the multilayer composite bonding material 130 and a bonding layer 122 or a bonding assist layer 122 may extend across a surface of the semiconductor device 120. FIG. 6 depicts the multilayer composite bonding material 130 with the core layer 132 and the single outer layer 134 proximate to the metal substrate 110 sandwiched between a pair of bonding layers 136. FIG. 7 depicts the multilayer composite bonding material 130 with the core layer 132, a first pair of outer layers 134a and a pair of additional core layers 132a sandwiched between the pair of bonding layers 136. It should be understood that other layered structures having a graded stiffness across the thickness of the multilayer composite bonding material 130 may be used to compensate for the thermal expansion and contraction experienced by the metal substrate 110 and semiconductor devices 120 and are included in the instant disclosure.

Figure 8:
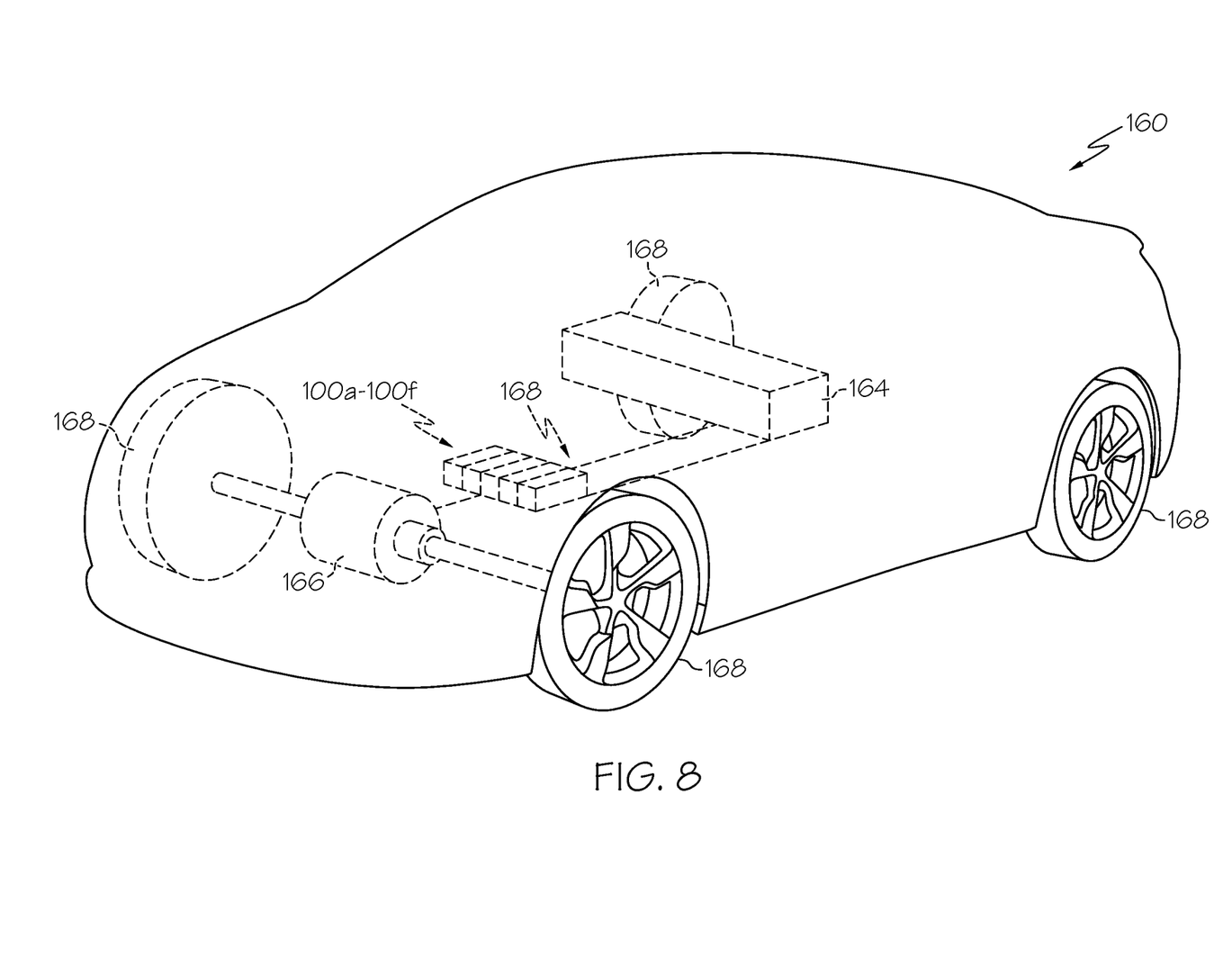
FIG. 8 schematically depicts a vehicle having a plurality of power electronics assemblies according to one or more embodiments shown and described herein.

As stated above, the metal substrates and power electronics assemblies described herein may be incorporated into an inverter circuit or system that converts direct current electrical power into alternating current electrical power and vice versa depending on the particular application. For example, in a hybrid electric vehicle application as illustrated in FIG. 8, several power electronics assemblies 100a-100f may be electrically coupled together to form a drive circuit that converts direct current electrical power provided by a bank of batteries 164 into alternating electrical power that is used to drive an electric motor 166 coupled to the wheels 168 of a vehicle 160 to propel the vehicle 160 using electric power. The power electronics assemblies 100a-100f used in the drive circuit may also be used to convert alternating current electrical power resulting from use of the electric motor 166 and regenerative braking back into direct current electrical power for storage in the bank of batteries 164.

Power semiconductor devices utilized in such vehicular applications may generate a significant amount of heat during operation, which require bonds between the semiconductor devices and metal substrates that can withstand higher temperatures and thermally-induced stresses due to CTE mismatch. The multilayer composites described and illustrated herein may compensate for the thermally-induced stresses generated during thermal bonding of the semiconductor devices to the metal substrate with a graded stiffness across the thickness of the multilayer composite bonding material while also providing a compact package design.

It should now be understood that the multilayer composites incorporated into the power electronics assemblies and vehicles described herein may be utilized to compensate thermally-induced stresses due to CTE mismatch without the need for additional interface layers, thereby providing for a more compact package design with reduced thermal resistance.

It is noted that the term "about" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A multilayer composite bonding material for transient liquid phase bonding comprising:
    thermal stress compensation layers sandwiched between a pair of bonding layers, the thermal stress compensation layers comprising a first core layer with a first stiffness sandwiched between a pair of outer layers with a second stiffness that is different than the first stiffness wherein the pair of outer layers with the second stiffness is sandwiched between a pair of second core layers with one of the first stiffness and a third stiffness, the third stiffness different from the first stiffness and the second stiffness, such that a graded stiffness extends across a thickness of the thermal stress compensation layers;
    wherein:
        the thermal stress compensation layers each have a melting point above a sintering temperature and the pair of bonding layers each have a melting point below the sintering temperature;
        the sintering temperature is in a range between about 280° C. and 350° C.

2. The multilayer composite bonding material of claim 1, wherein the first stiffness is less than the second stiffness.

3. The multilayer composite bonding material of claim 1, wherein the pair of bonding layers each have a thickness between about 2 microns and about 10 microns.

4. The multilayer composite bonding material of claim 1, wherein at least one of the first core layer and each of the pair of second core layers has a thickness between about 50 microns and about 150 microns.

5. The multilayer composite bonding material of claim 1, wherein the pair of outer layers each have a thickness between about 2 microns and about 10 microns.

6. The multilayer composite bonding material of claim 1, wherein at least one of the first core layer and the pair of second core layers comprises aluminum, the pair of outer layers comprise copper and the pair of bonding layers comprise tin.

7. The multilayer composite bonding material of claim 1, wherein at least one of the first core layer and the pair of second core layers comprises magnesium, the pair of outer layers comprise copper and the pair of bonding layers comprise tin.

8. A power electronics assembly for transient liquid phase bonding comprising:
    a semiconductor device extending across a metal substrate; and
    a multilayer composite bonding material comprising thermal stress compensation layers sandwiched between a pair of bonding layers and that is transient liquid phase (TLP) bonded to the semiconductor device and the metal substrate, the thermal stress compensation layers comprising a first core layer with a first stiffness sandwiched between a pair of outer layers with a second stiffness that is different than the first stiffness, wherein the pair of outer layers with the second stiffness is sandwiched between a pair of second core layers with one of the first stiffness and a third stiffness, the third stiffness different from the first stiffness and the second stiffness, such that a graded stiffness extends across a thickness of the thermal stress compensation layers;
    wherein the thermal stress compensation layers each have a melting point above a TLP sintering temperature, and the pair of bonding layers each have a melting point below the TLP sintering temperature, the TLP sintering temperature being in a range between about 280° C. and 350° C.

9. The power electronics assembly of claim 8, wherein the first stiffness is less than the second stiffness.

10. The power electronics assembly of claim 8, wherein at least one of the first core layer and each of the pair of second core layers has a thickness between about 50 microns and about 150 microns and the pair of outer layers each have a thickness between about 2 microns and about 10 microns.

11. The power electronics assembly of claim 8, wherein the at least one of the first core layer and the pair of second core layers comprises aluminum and the pair of outer layers comprise copper.

12. The power electronics assembly of claim 8, wherein at least one of the first core layer and the pair of second core layers comprises magnesium, the pair of outer layers comprise copper and the pair of bonding layers comprise tin.

13. The power electronics assembly of claim 8, wherein the semiconductor device is formed from a wide band gap semiconductor material comprising at least one of silicon carbide (SiC), silicon dioxide ($SiO_2$), aluminum nitride (AlN), gallium nitride (GaN), boron nitride (BN) and diamond.

14. The power electronics assembly of claim 8, wherein the metal substrate is formed from copper.

15. A process for manufacturing a power electronics assembly through transient liquid phase bonding comprising:
    positioning a multilayer composite bonding material between a metal substrate and a semiconductor device to provide a metal substrate/semiconductor device assembly, the multilayer composite bonding material comprising thermal stress compensation layers sandwiched between a pair of bonding layers, the thermal stress compensation layers comprising a first core layer with a first stiffness sandwiched between a pair of outer layers with a second stiffness that is different than the first stiffness, wherein the pair of outer layers with the second stiffness is sandwiched between a pair of second core layers with one of the first stiffness and a third stiffness, the third stiffness different from the first stiffness and the second stiffness, such that a graded stiffness is present across a thickness of the thermal stress compensation layers;

heating the metal substrate/semiconductor device assembly to a transient liquid phase (TLP) sintering temperature between about 280° C. and 350° C., wherein the pair of bonding layers each have a melting point less than the TLP sintering temperature and the thermal stress compensation layers each have a melting point greater than the TLP sintering temperature such that the pair of bonding layers at least partially melt and form a TLP bond with the metal substrate and the semiconductor device; and cooling the power electronics assembly from the TLP sintering temperature to ambient temperature, wherein the multilayer composite bonding material with the graded stiffness compensates for thermal contraction mismatch between the semiconductor device and the metal substrate during cooling from the TLP sintering temperature to ambient temperature.

16. The process of claim 15, wherein the first stiffness is less than the second stiffness.

17. The process of claim 15, at least one of the first core layer and each of the pair of second core layers has a thickness between about 50 microns and about 150 microns, the pair of outer layers each have a thickness between about 2 microns and about 10 microns, and the pair of bonding layers each have a thickness between 2 microns and about 10 microns.

18. The process of claim 15, wherein at least one of the first core layer and the second core layers comprises aluminum, the pair of outer layers comprise copper and the pair of bonding layers comprise tin.

19. The process of claim 15, wherein at least one of the first core layer and the pair of second core layers comprises magnesium, the pair of outer layers comprise copper and the pair of bonding layers comprise tin.

20. The process of claim 15, wherein the metal substrate is formed from copper and the semiconductor device is formed from a wide band gap semiconductor material comprising at least one of silicon carbide (SiC), silicon dioxide ($SiO_2$), aluminum nitride (AlN), gallium nitride (GaN), boron nitride (BN) and diamond.

* * * * *

UNITED STATES PATENT AND TRADEMARK OFFICE
CERTIFICATE OF CORRECTION

PATENT NO. : 10,381,223 B2
APPLICATION NO. : 15/824573
DATED : August 13, 2019
INVENTOR(S) : Shailesh N. Joshi It is certified that error appears in the above-identified patent and that said Letters Patent is hereby corrected as shown below:

On the Title Page

In page 2, item (56), references cited, U.S. patent documents, cite no. 1, US2014/0238213, delete "Monceau et al." and insert --Moriceau et al.--, therefor.

In the Claims

In Column 11, Claim 1, Line 44, after "first stiffness", insert --,--.

Signed and Sealed this
Fifth Day of November, 2019

Andrei Iancu
*Director of the United States Patent and Trademark Office*